United States Patent
Oikawa et al.

(10) Patent No.: US 11,211,229 B2
(45) Date of Patent: *Dec. 28, 2021

(54) PROCESSING METHOD AND PLASMA PROCESSING APPARATUS

(71) Applicant: Tokyo Electron Limited, Tokyo (JP)

(72) Inventors: Sho Oikawa, Miyagi (JP); Seiji Yokoyama, Miyagi (JP); Taichi Okano, Miyagi (JP); Shunichi Kawasaki, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/735,858

(22) Filed: Jan. 7, 2020

(65) Prior Publication Data
US 2020/0227241 A1 Jul. 16, 2020

(30) Foreign Application Priority Data

Jan. 11, 2019 (JP) .............................. JP2019-003759

(51) Int. Cl.
| | |
|---|---|
| *H01J 37/32* | (2006.01) |
| *H01L 21/67* | (2006.01) |
| *H01L 21/3213* | (2006.01) |
| *H01L 21/3065* | (2006.01) |
| *H01L 21/66* | (2006.01) |

(52) U.S. Cl.
CPC .. *H01J 37/32183* (2013.01); *H01J 37/32642* (2013.01); *H01L 21/3065* (2013.01); *H01L 21/32136* (2013.01); *H01L 21/67253* (2013.01); *H01L 22/00* (2013.01); *H01L 22/20* (2013.01); *B81C 2201/0142* (2013.01); *H01J 2237/3341* (2013.01)

(58) Field of Classification Search
None
See application file for complete search history.

(56) References Cited

U.S. PATENT DOCUMENTS 9,852,889 B1 * 12/2017 Kellogg ............ H01J 37/32091

FOREIGN PATENT DOCUMENTS

| | | | |
|---|---|---|---|
| JP | 2007250967 | * | 9/2007 |
| JP | 2007-258417 | | 10/2007 |
| JP | 2007258417 | * | 10/2007 |
| JP | 2015-173240 | | 10/2015 |

* cited by examiner

*Primary Examiner* — Stephanie P Duclair
(74) *Attorney, Agent, or Firm* — IPUSA, PLLC

(57) ABSTRACT

A method of processing an object using a plasma processing apparatus is provided. The plasma processing apparatus includes a stage on which the object is placed in a chamber, an outer peripheral member disposed around the stage, a first power supply configured to apply voltage to the outer peripheral member, and a memory storing information about a relationship between the voltage applied to the outer peripheral member and an adjustment amount of a process parameter. The method includes: applying voltage from the first power supply to the outer peripheral member; adjusting the process parameter based on the voltage applied to the outer peripheral member, by referring to the information stored in the memory; and performing a plasma process under a process condition including the adjusted process parameter.

5 Claims, 5 Drawing Sheets

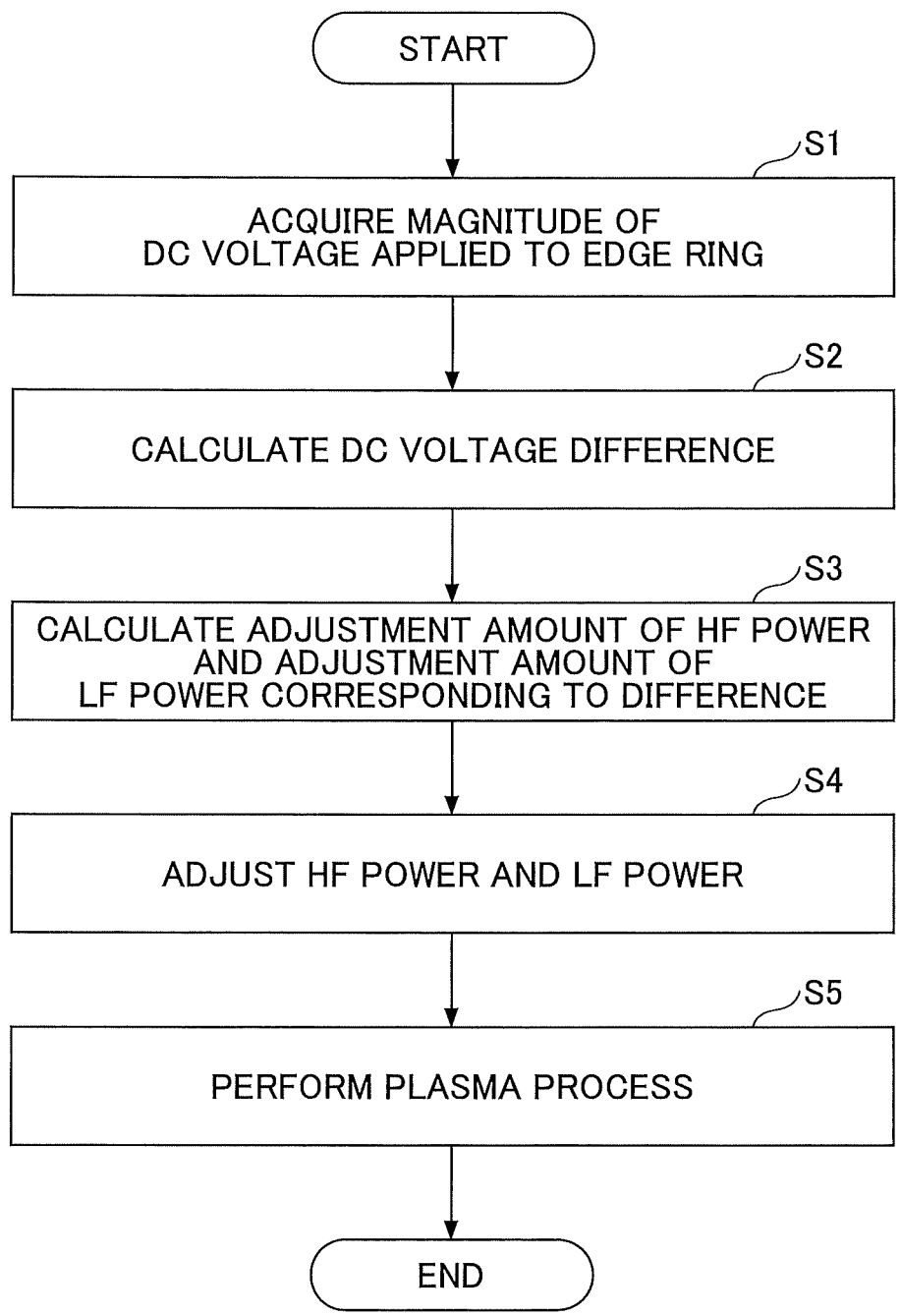

PROCESSING METHOD AND PLASMA PROCESSING APPARATUS

CROSS-REFERENCE TO RELATED APPLICATIONS

This patent application is based on and claims priority to Japanese Patent Application No. 2019-003759 filed on Jan. 11, 2019, the entire contents of which are incorporated herein by reference.

TECHNICAL FIELD

The present disclosure relates to a processing method and a plasma processing apparatus.

BACKGROUND

An outer peripheral member (may also be referred to as an edge ring) disposed around a wafer is worn by exposure to plasma. The wear of the edge ring affects results of processing applied to the wafer, and leads to deterioration of process characteristics such as an etch shape and an etch rate. Accordingly, Patent Document 1 proposes a technique for reducing influence on a processing result such as the etch shape, caused by wear of the edge ring.

CITATION LIST

Patent Document

[Patent Document 1] Japanese Laid-open Patent Application Publication No. 2007-258417

SUMMARY

The present disclosure provides a technique for avoiding degradation of process characteristics with respect to an object when a voltage is applied to an outer peripheral member.

According to one aspect of the present disclosure, a method of processing an object using a plasma processing apparatus is provided. The plasma processing apparatus includes a stage on which the object is placed in a chamber, an outer peripheral member disposed around the stage, a first power supply configured to apply voltage to the outer peripheral member, and a memory storing information about a relationship between the voltage applied to the outer peripheral member and an adjustment amount of a process parameter. The method includes: applying voltage from the first power supply to the outer peripheral member; adjusting the process parameter based on the voltage applied to the outer peripheral member, by referring to the information stored in the memory; and performing a plasma process under a process condition including the adjusted process parameter.

BRIEF DESCRIPTION OF THE DRAWINGS

FIG. 6 is a flowchart illustrating an example of the processing method according to the embodiment.

DETAILED DESCRIPTION OF EMBODIMENTS

In the following, embodiments of the present invention will be described with reference to the drawings. Note that in the following drawings, elements having substantially identical features are given the same reference symbols and overlapping descriptions may be omitted.

[Plasma Processing Apparatus]

Figure 1:
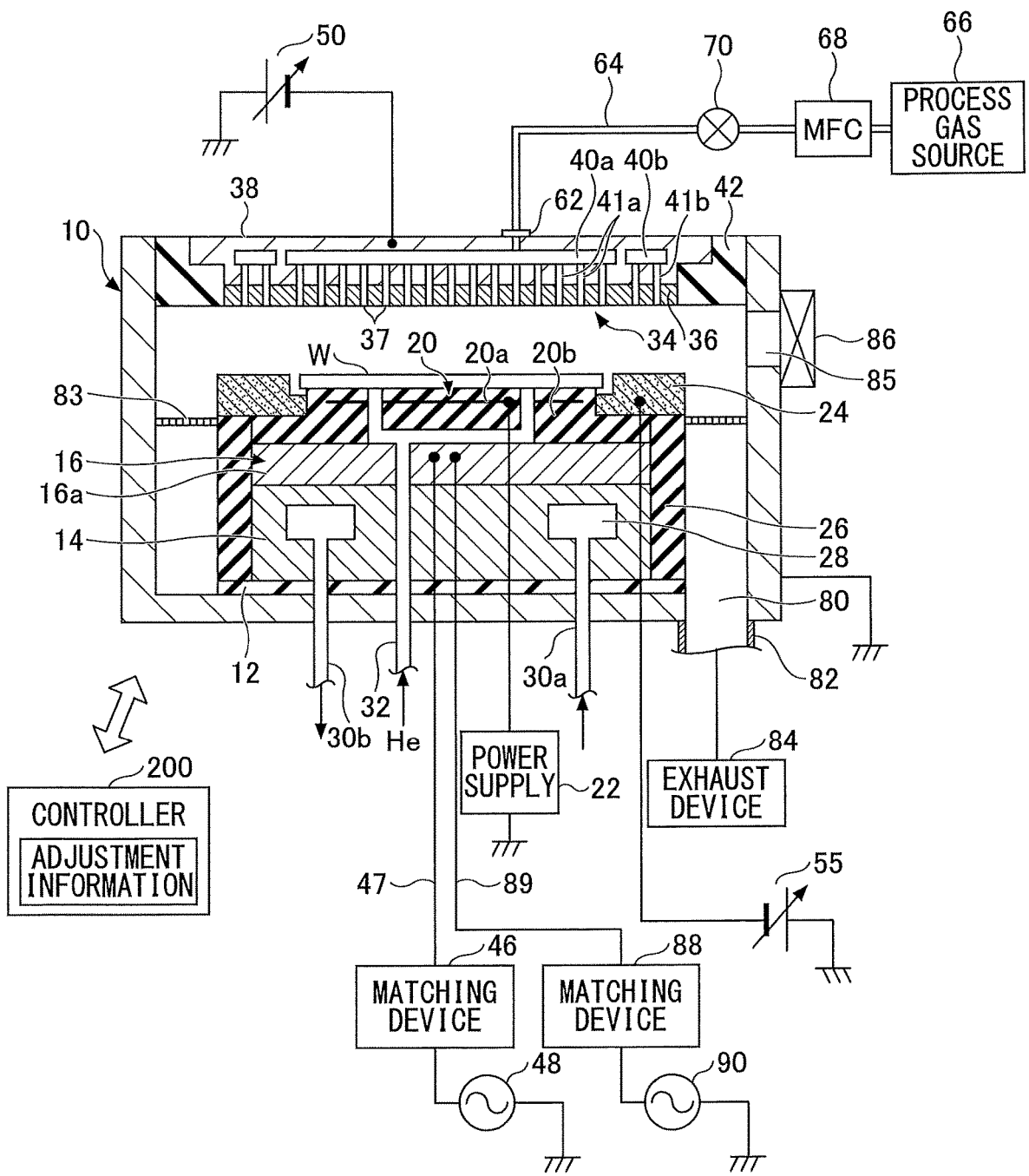
FIG. 1 is a cross-sectional view illustrating an example of a plasma processing apparatus according to an embodiment.

A plasma processing apparatus 1 according to an embodiment will be described with reference to FIG. 1. FIG. 1 is a cross-sectional view illustrating an example of the plasma processing apparatus 1 according to the present embodiment. The plasma processing apparatus 1 according to the present embodiment is a capacitively coupled parallel plate processing apparatus, and includes a chamber 10. The chamber 10 is a cylindrical container made of aluminum whose surface is anodized for example. The chamber 10 is grounded.

A cylindrical support 14 is disposed at a bottom of the chamber 10 via an insulating plate 12 that is made of ceramic or the like, and a stage 16, for example, is provided on the support 14. The stage 16 includes an electrostatic chuck 20 and a base 16a, and a wafer W is placed on an upper surface of the electrostatic chuck 20. Around the wafer W, an annular edge ring 24 made of silicon for example is provided. The edge ring 24 may also be referred to as a focus ring. The edge ring 24 is an example of an outer peripheral member disposed around the stage 16. Around the base 16a and the support 14, an annular insulator ring 26 made of quartz for example is provided. Inside the electrostatic chuck 20, a first electrode 20a of a conductive film is embedded in an insulating layer 20b at a central portion of the electrostatic chuck 20. The first electrode 20a is connected to a power supply 22. Direct current (DC) voltage applied from the power supply 22 to the first electrode 20a generates electrostatic force that attracts the wafer W to the surface of the electrostatic chuck 20 on which the wafer W is placed. The electrostatic chuck 20 may include a heater to control temperature.

Inside the support 14, a coolant chamber 28 is formed, for example, in the form of a ring or a spiral. Coolant at a predetermined temperature supplied from a chiller unit (not illustrated), such as cooling water, passes through a pipe 30a, the coolant chamber 28, and a pipe 30b, and is returned to the chiller unit. By circulating the coolant through the above-described path, a temperature of the wafer W can be controlled by the temperature of the coolant. In addition, heat transfer gas such as He gas, which is supplied from a heat transfer gas supply mechanism, is supplied through a gas supply line 32 to a gap between the upper surface of the electrostatic chuck 20 and a bottom surface of the wafer W. This heat transfer gas reduces a heat transfer coefficient between the upper surface of the electrostatic chuck 20 and the bottom surface of the wafer W, and makes temperature control of the wafer W by the temperature of the coolant more effective. In addition, in a case in which the electrostatic chuck 20 includes a heater, heating by the heater and cooling by the coolant enable high responsiveness and high precision control of the temperature of the wafer W.

An upper electrode 34 is provided on a ceiling of the chamber 10 so as to face the stage 16. Between the upper electrode 34 and the stage 16 is a plasma processing space. The upper electrode 34 occludes an aperture of the ceiling of the chamber 10 via an insulating shielding member 42. The upper electrode 34 includes an electrode plate 36 and an electrode support 38. The electrode plate 36 includes a large number of gas discharge holes 37 on a surface facing the stage 16, and is formed of a silicon-containing material such as silicon or SiC. The electrode support 38 detachably supports the electrode plate 36, and is formed of a conductive material, such as aluminum whose surface is anodized. Inside the electrode support 38, a large number of gas flow holes 41$a$ and 41$b$ extend downwardly from gas diffusion chambers 40$a$ and 40$b$ respectively, and the gas flow holes 41$a$ and 41$b$ communicate with the gas discharge holes 37.

A gas inlet 62 is connected to a process gas source 66 via a gas supply line 64. The gas supply line 64 is provided with a mass flow controller (MFC) 68 and an open/close valve 70 from an upstream side in which the process gas source 66 is provided. A process gas is supplied from the process gas source 66, and a gas flow is controlled by the mass flow controller 68 and the open/close valve 70. The process gas supplied from the process gas source 66 passes through the gas supply line 64, and is discharged in a shower-like manner from the gas discharge holes 37, through the gas diffusion chamber 40$a$ and the gas flow holes 41$a$ (or through the gas diffusion chamber 40$b$ and the gas flow holes 41$b$).

The plasma processing apparatus 1 includes a first radio frequency power supply 90 and a second radio frequency power supply 48. The first radio frequency power supply 90 is a power source that generates first radio frequency power (hereinafter referred to as "HF power"). The first radio frequency power has a frequency suitable for generating a plasma. The frequency of the first radio frequency power is, for example, within a range from 27 MHz to 100 MHz. The first radio frequency power supply 90 is connected to the base 16$a$ via a matching device 88 and a power supply line 89. The matching device 88 includes circuitry for causing output impedance of the first radio frequency power supply 90 to match impedance of a load (base 16$a$ side). The first radio frequency power supply 90 may be connected to the upper electrode 34 via the matching device 88.

The second radio frequency power supply 48 is a power source that generates second radio frequency power (hereinafter referred to as "LF power"). The second radio frequency power has a frequency lower than the frequency of the first radio frequency power. In a case in which the second radio frequency power is used in conjunction with the first radio frequency power, the second radio frequency power is used as radio frequency power for attracting ions into the wafer W. The frequency of the second radio frequency power is, for example, within a range from 400 kHz to 13.56 MHz. The second radio frequency power supply 48 is connected to the base 16$a$ via a matching device 46 and a power supply line 47. The matching device 46 includes circuitry for causing output impedance of second radio frequency power supply 48 to match impedance of the load (base 16$a$ side).

It should be noted that a plasma may be generated using the second radio frequency power without using the first radio frequency power. That is, a plasma may be generated by using only a single type of radio frequency power. In such a case, a frequency of the second radio frequency power may be greater than 13.56 MHz, for example 40 MHz. The plasma processing apparatus 1 may not include the first radio frequency power supply 90 and the matching device 88. According to this configuration, the stage 16 also functions as a lower electrode. The upper electrode 34 also functions as a showerhead for supplying gas.

A second variable power supply 50 is connected to the upper electrode 34, and applies DC voltage to the upper electrode 34. A first variable power supply 55 is connected to the edge ring 24, and applies DC voltage to the edge ring 24. The first variable power supply 55 is an example of a first power supply that applies voltage to the outer peripheral member. The second variable power supply 50 is an example of a second power supply that applies voltage to the upper electrode 34.

An exhaust device 84 is connected to an exhaust pipe 82. The exhaust device 84 includes a vacuum pump such as a turbomolecular pump, which performs evacuation from an exhaust port 80 formed at the bottom of the chamber 10 through the exhaust pipe 82, to reduce pressure in the chamber 10 to a desired quality of vacuum. The exhaust device 84 also controls pressure in the chamber 10 to be constant, by observing magnitude of pressure in the chamber 10 using a pressure gauge (not illustrated) that measures pressure in the chamber 10. An inlet/outlet port 85 is provided on a side wall of the chamber 10. The wafer W is loaded and unloaded from the inlet/outlet port 85, by opening and closing a gate valve 86.

A baffle plate 83 is annularly provided between the insulator ring 26 and the side wall of the chamber 10. The baffle plate 83 has multiple through-holes. The baffle plate 83 is formed of aluminum and has a surface coated with ceramic such as $Y_2O_3$.

When a predetermined plasma process, such as a plasma etching process, is performed in the plasma processing apparatus 1 according to the above-described configuration, the gate valve 86 is opened, the wafer W is loaded into the chamber 10 via the inlet/outlet port 85 to place the wafer W on the stage 16, and the gate valve 86 is closed. A process gas is supplied to the interior of the chamber 10, and the chamber 10 is evacuated by the exhaust device 84.

The first radio frequency power and the second radio frequency power are applied to the stage 16. DC voltage is applied from the power supply 22 to the first electrode 20$a$ to cause the wafer W to be attracted to the stage 16. The DC voltage may be applied from the second variable power supply 50 to the upper electrode 34.

The plasma process such as etching is applied to a surface to be processed of the wafer W, by means of radicals or ions in the plasma generated in the plasma processing space.

The plasma processing apparatus 1 includes a controller 200 for controlling an entire operation of the plasma processing apparatus 1. A processor (CPU) provided in the controller 200 performs a desired plasma process such as etching, according to a recipe stored in a memory, such as a ROM or a RAM. The recipe may include process time, pressure (gas exhaust), first and second radio frequency power, voltage, and various gas flow rates, which are control information of the plasma processing apparatus 1 corresponding to a process condition. The recipe may also include a temperature in the chamber (upper electrode temperature, chamber sidewall temperature, wafer W temperature, electrostatic chuck temperature, etc.), a coolant temperature output from the chiller, and the like. Programs and the recipe representing the aforementioned process conditions may be stored in a hard disk drive or a semiconductor memory. The recipe may also be stored in a portable computer-readable recording medium such as a CD-ROM or a DVD, and the computer-readable recording medium may be set to a predetermined position in an accessible state.

[Abrasion of Edge Ring]

Figure 2A:
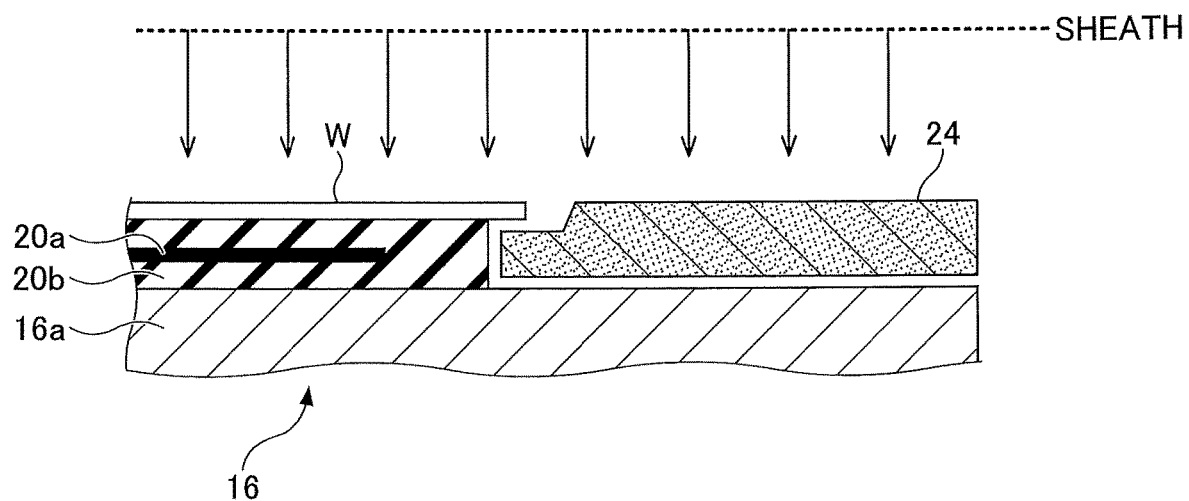
FIGS. 2A and 2B are diagrams illustrating tilting caused by abrasion of an edge ring.
Figure 2B:
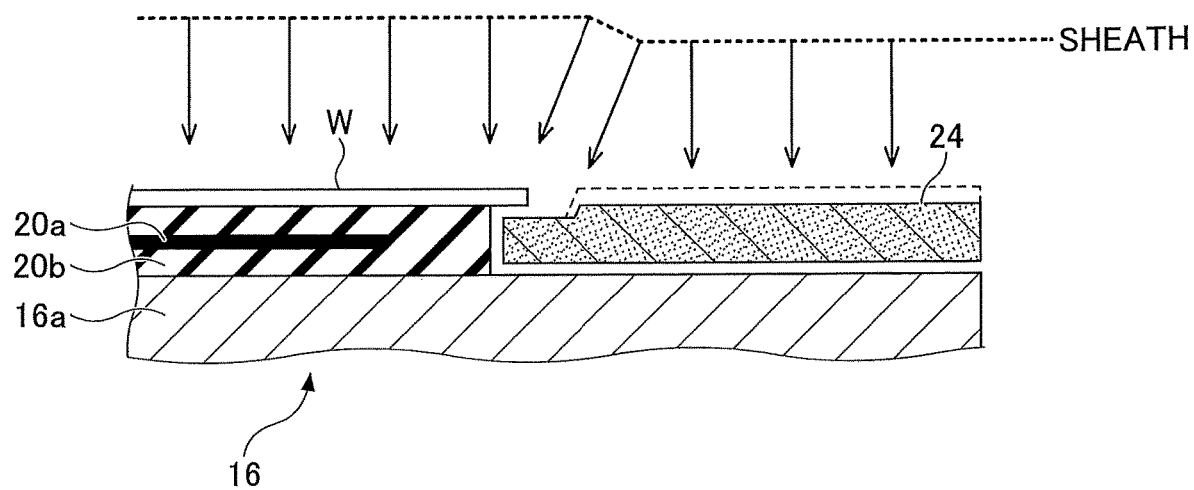

Next, with reference to FIGS. 2A and 2B, changes in a sheath caused by abrasion of the edge ring 24, and occurrence of tilting will be described. FIGS. 2A and 2B are diagrams illustrating tilting caused by abrasion of the edge ring.

As illustrated in FIG. 2A, a thickness of the edge ring 24 is designed so that the upper surface of the wafer W and the upper surface of the edge ring 24 are at the same height when the edge ring 24 is new. At this time, a sheath above the wafer W and a sheath above the edge ring 24, which are generated during plasma processing, become of the same thickness, and a level difference does not occur.

At this state, incident angles of ions in the plasma that are incident on the wafer W and the edge ring 24 become generally perpendicular to these surfaces. As a result, a shape (etching shape) of a recess formed on the wafer W becomes perpendicular at both the central portion of the wafer W and the edge portion of the wafer W. That is, tilting, in which a recess formed on the wafer W becomes inclined, does not occur.

During plasma processing, the edge ring 24 is exposed to the plasma and is gradually abraded. Thus, as illustrated in FIG. 2B, the edge ring 24 becomes thinner, and a height of the upper surface of the edge ring 24 becomes lower than that of the wafer W. As a result, a level difference occurs between the sheath above the edge ring 24 and the sheath above the wafer W.

In this case, as illustrated by line arrows in FIG. 2B, because incident angles of ions become inclined at an edge of the wafer W, tilting occurs in which a shape of a recess formed on the wafer W becomes inclined.

To deal with the problem, if DC voltage is applied from the first variable power supply 55 to the edge ring 24 in accordance with an amount of abrasion of the edge ring 24, a thickness of the sheath can be controlled. This eliminates a level difference between a sheath above the edge ring 24 and a sheath above the wafer W, and avoids occurrence of tilting.

[Etch Rate Variation]

Figure 3:
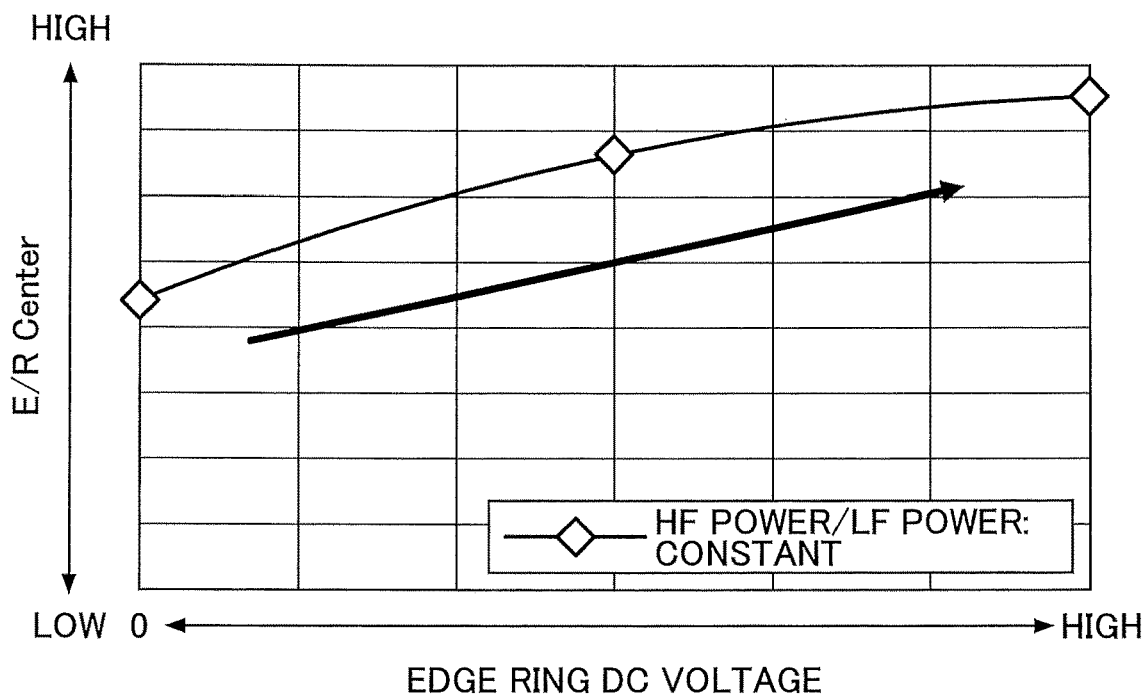
FIG. 3 is a graph illustrating an example of a relationship between an etch rate and voltage applied to the edge ring.

However, it has been found that applying DC voltage to the edge ring 24 during plasma processing affects a process characteristic of the wafer W. A graph in FIG. 3 illustrates an example of a result of an experiment in which the wafer W is plasma etched while DC voltage is applied to the edge ring 24. Process conditions in this experiment are as follows.

<Process Conditions>

Gas: $CF_4$ gas, $C_4F_8$ gas, $N_2$ gas

HF power: constant

LF power: constant

The horizontal axis of FIG. 3 indicates DC voltage (edge ring DC voltage) applied to the edge ring, and the vertical axis indicates an etch rate (E/R) at the center of the wafer W. According to the result of this experiment, it was found that an etch rate of a central portion of the wafer W increases by applying DC voltage to the edge ring 24. Also, it was found that the etch rate increases as the DC voltage applied to the edge ring 24 increases.

Figure 4:
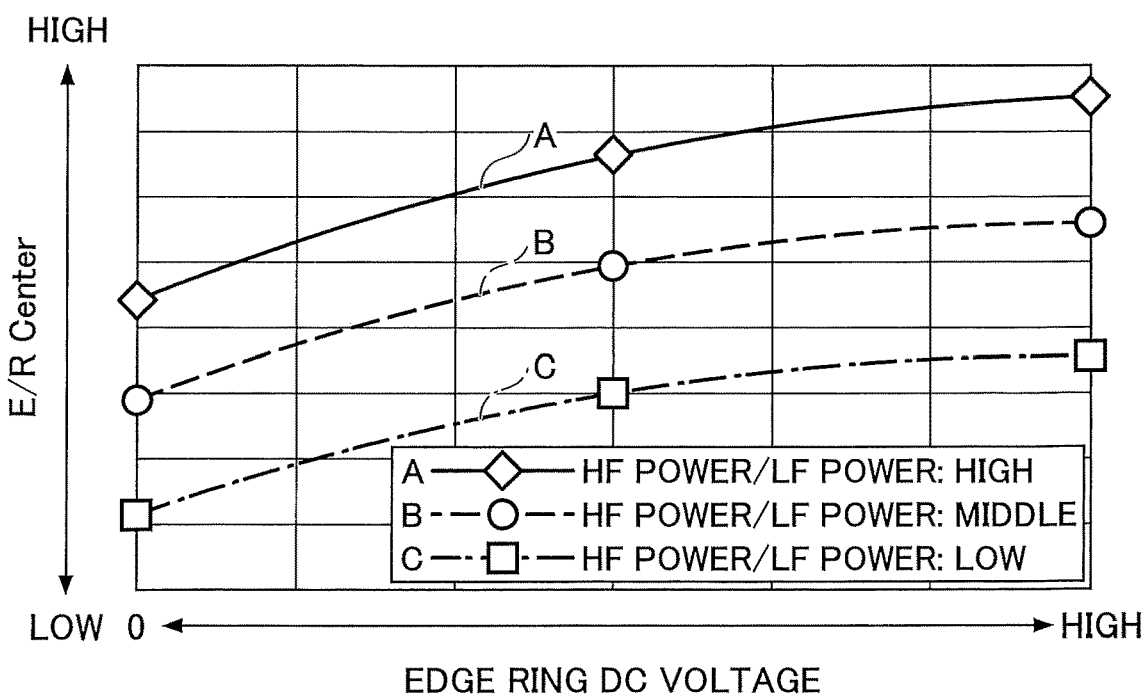
FIG. 4 is a graph illustrating other examples of the relationship between the etch rate and the voltage applied to the edge ring.

In addition, another experiment of observing variation in etch rate was performed, by changing magnitude of HF power and LF power to three levels of magnitude, in addition to changing the edge ring DC voltage. FIG. 4 illustrates the result of this experiment. Process conditions of this experiment are the same as that in FIG. 3, other than HF power and LF power.

A curve B illustrated in FIG. 4 is a result of variation in etch rate when a certain magnitude of HF power and LF power was applied. In the following description, the magnitude of HF power and LF power used for measuring the variation corresponding to the curve B is referred to as "reference power", and is denoted by "middle" in FIG. 4.

A curve A is a result of variation in etch rate when HF power and LF power higher than the reference power was applied. A curve C is a result of variation in etch rate when HF power and LF power lower than the reference power was applied.

According to these results, in each of the above-described cases (curve A, curve B, and curve C), trend of variation in etch rate was similar, in which the etch rate increases in accordance with increase in the edge ring DC voltage. In other words, it was found that, by applying DC voltage to the edge ring 24, an etch rate of a central portion of the wafer W increases, and controllability of the etch rate deteriorates.

[Adjusting HF Power and LF Power]

Therefore, based on etch rates (at a central portion of a wafer W) that are measured by changing DC voltage applied to the edge ring 24, HF power, and LF power, an approximation equation representing a relationship between the etch rate, the DC voltage applied to the edge ring 24, the HF power, and the LF power, is obtained. Then, by using the approximation equation, adjustment amounts of the HF power and the LF power, which are required for making the etch rate when DC voltage is applied to the edge ring 24 equal to the etch rate when DC voltage is not applied to the edge ring 24, are estimated.

According to this, a shift (increase) of an etch rate in a center of a wafer W that occurs when DC voltage is applied to the edge ring 24 can be suppressed, by adjusting HF power and LF power applied during plasma processing based on the adjustment amount of the HF power and the adjustment amount of the LF power. This increases in-plane uniformity or controllability of an etch rate, and prevents degradation of process characteristics to a wafer W when voltage is applied to the edge ring 24.

Figure 5A:
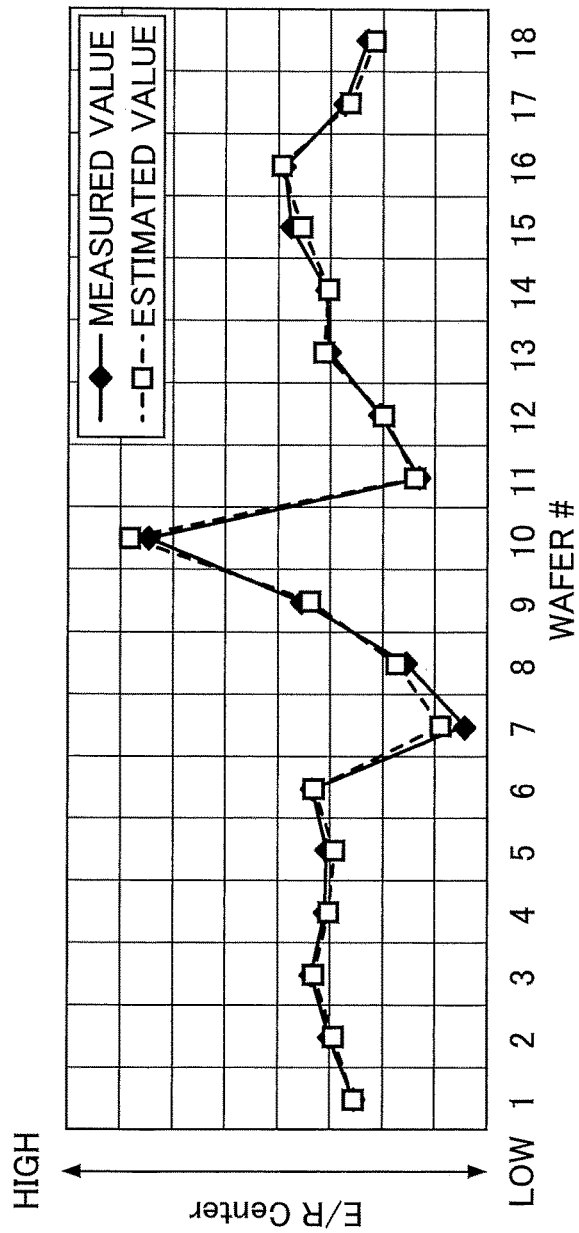
FIG. 5A is a graph illustrating an example of processing results of a processing method according to the embodiment.

FIG. 5A illustrates a measurement result of etch rates of central portions of wafers W, which have been etched by changing process parameters for each of the wafers W. This experiment has been made using an experimental design method. The horizontal axis of FIG. 5A indicates a wafer number, and the vertical axis indicates the etch rate of the central portion of the wafer W. A solid line curve labeled as "MEASURED VALUE" in FIG. 5A represents the measurement result of the etch rates.

A dotted line curve labeled as "ESTIMATED VALUE" in FIG. 5A represents a result of calculating (estimating) etch rates of a central portion of a wafer by changing process parameters. In calculating (estimating) the etch rates, an approximation equation representing a relationship between process parameters and an etch rate of a central portion of a wafer was obtained, by using multivariate analysis of the measurement result of the etch rates, and values on the dotted line curve are calculated using the obtained approximation equation. According to this, accuracy of the approximation equation is high because the curve "ESTIMATED VALUE" is almost the same as the curve "MEASURED VALUE".

Figure 5B:
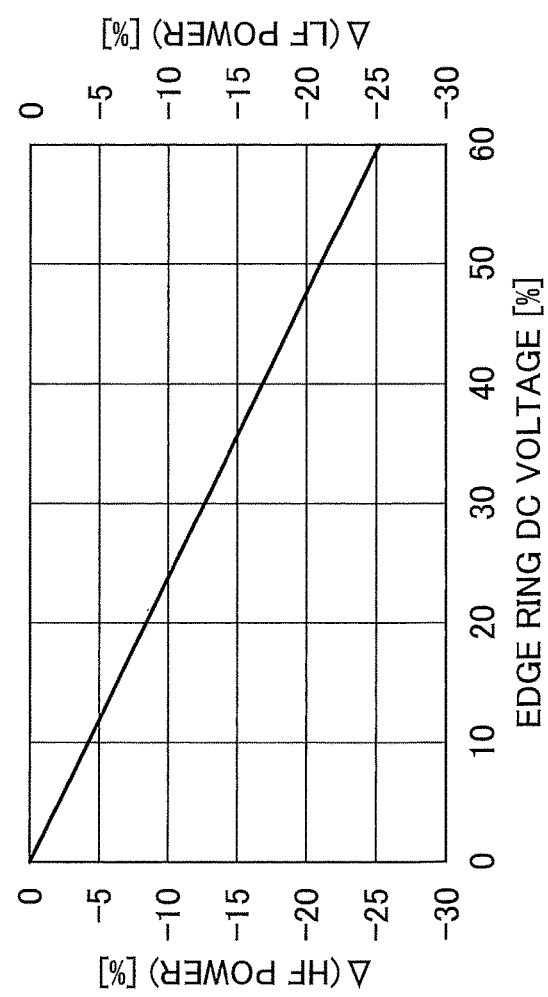
FIG. 5B is a graph illustrating a relationship between the voltage applied to the edge ring, HF power, and LF power.

FIG. 5B represents correlation information obtained by estimating correlation between voltage applied to the edge ring 24 and the adjustment amounts of the HF power and the LF power when an etch rate of a central portion of a wafer W is constant, which is estimated based on the above-described approximation equation.

According to the present embodiment, by adjusting HF power and LF power, an etch rate at a center of a wafer W is not shifted even in a case in which DC voltage is applied to the edge ring 24. Therefore, controllability of the etch rate can be ensured.

Although FIG. 5B illustrates the correlation between voltage applied to the edge ring, HF power, and the LF power when the HF power and the LF power are adjusted by the same ratio, the HF power and the LF power are not required to be adjusted by the same ratio.

[Adjusting Process Parameter]

The approximation equation used may be a linear function, or other functions (such as a quadratic function), if a result obtained by the approximation equation becomes close to an actual measured value. By adjusting HF power and LF power using such an approximation equation, in-plane uniformity of process characteristics of a wafer W can be ensured without changing an etch rate of the central portion of the wafer W.

Adjustment amounts of HF power and LF power that are required for not changing an etch rate of a central portion of a wafer, in a case in which DC voltage at a certain level is applied to the edge ring 24 (or in which DC voltage applied to the edge ring 24 is changed by a certain amount), can be estimated by using the approximation equation. Therefore, correlation information indicating the relationship between DC voltage applied to the edge ring, HF power, and LF power, which is estimated based on the approximation equation, may be stored in the memory of the controller 200 in advance (note that the correlation information may also be referred to as "adjustment information").

For example, in the graph illustrated in FIG. 5B, the horizontal axis indicates a ratio of DC voltage applied to the edge ring 24 to a maximum output value of the first variable power supply 55 (e.g. maximum voltage that can be applied to the edge ring 24), while the vertical axis on the left side indicates an adjustment amount of HF power that is expressed as a ratio (%) of a change amount (decrease amount) of HF power to default HF power that is applied when DC voltage is not applied to the edge ring 24, and the vertical axis on the right side indicates an adjustment amount of LF power that is expressed as a ratio (%) of a change amount (decrease amount) of LF power to default LF power that is applied when DC voltage is not applied to the edge ring 24.

The example of FIG. 5B indicates that, if the DC voltage applied to the edge ring 24 is increased by "30%", the HF power should be reduced by "12.5%" from the default HF power and the LF power should be reduced by "12.5%" from the default LF power. Then, the HF power after adjustment and the LF power after adjustment are applied to the base 16a.

As described above, by adjusting magnitude of HF power and LF power in accordance with DC voltage applied to the edge ring 24 or variation of DC voltage applied to the edge ring 24, increase in etch rate of a central portion of a wafer W can be suppressed even if DC voltage is applied to the edge ring 24. Thus, tilting of an edge portion of the wafer W can be suppressed by applying DC voltage to the edge ring 24, while increasing controllability of the etch rate.

In the present embodiment, HF power and LF power are adjusted according to magnitude of DC voltage applied to the edge ring 24 or variation of DC voltage applied to the edge ring 24, but process parameters to be adjusted according to the DC voltage applied to the edge ring 24 are not limited to HF power and LF power. Any process parameter in a process condition that affects density of plasma to be generated (e.g. a process parameter that causes plasma density to vary in accordance with change in the process parameter) may be chosen as a process parameter to be adjusted. A process parameter in a process condition to be adjusted may be, for example, a process parameter that affects an etch rate (e.g. a process parameter that causes an etch rate to vary in accordance with change in the process parameter).

For example, a process parameter to be adjusted may be LF power only or HF power only. Process parameters to be adjusted may be DC voltage applied from the second variable power supply 50 to the upper electrode 34, a type of gas supplied from the process gas source 66 and/or a flow rate of the gas, or pressure in the chamber 10.

That is, a process parameter may be at least one of: radio frequency power at a first frequency applied from the first radio frequency power supply 90, radio frequency power at a second frequency lower than the first frequency applied from the second radio frequency power supply 48, gas supplied to the chamber 10, pressure in the chamber 10, and voltage applied from the second variable power supply 50 to the upper electrode 34.

[Processing Method Including Adjustment Process]

Finally, an adjustment process performed by the controller 200 according to the present embodiment will be described with reference to FIG. 6. FIG. 6 is a flowchart illustrating an example of a processing method including the adjustment process according to the present embodiment. A program that causes the controller 200 to execute the adjustment process is stored in the memory of the controller 200, and the program is loaded from the memory by the CPU in the controller 200, and is executed by the CPU.

When the present process is started, the controller 200 acquires (measures) magnitude of DC voltage applied to the edge ring 24 (step S1). In the following description, the magnitude of DC voltage applied to the edge ring 24 that is measured in step S1 may also be referred to as a "DC voltage value". Next, in step S2, the controller 200 calculates a difference between a DC voltage value measured in the current processing (this time) and a DC voltage value measured in the previous processing (the last time when the present process was performed). A time interval of acquiring the DC voltage values (e.g. a period between execution of step S1 in the previous processing and execution of step S1 in the current processing) may be determined freely. Also, a difference calculated in step S2 is not limited to the difference between the DC voltage value of this time and the previous DC voltage value, but may be a difference between the DC voltage value of this time and a DC voltage value obtained at a time before last. For example, a difference between the current DC voltage and an average of the previous DC voltage value and the DC voltage value obtained at a time before last may be used.

Next, in step S3, the controller 200 calculates adjustment amounts of HF power and LF power corresponding to the difference in the DC voltage value calculated in step S2, by referring to correlation information of a difference in the DC voltage applied to the edge ring 24 and the adjustment amounts of HF power and LF power. As described with reference to FIG. 5B, the correlation information is stored in the memory in advance. The correlation information illustrated in FIG. 5B is an example of information indicating a correlation between DC voltage applied to the edge ring 24 and an adjustment amount of the process parameter, and is not limited thereto. The correlation information may be information indicating a correlation between an adjustment amount of the process parameter and a difference in DC voltage values (difference between the current DC voltage value and the previous DC voltage value), or may be information indicating a correlation between a DC voltage value and the adjustment amount of the process parameter. In the latter case, step S2 may not be performed, and an adjustment amount of HF power and an adjustment amount of LF power corresponding to the DC voltage value acquired in step S1 may be calculated in step S3, by referring to the correlation information stored in the memory.

Next, the controller 200 adjusts a value of HF power set in the recipe by using the adjustment amount of the HF power calculated in step S3, and determines the adjusted value of HF power as HF power after adjustment (step S4). Also, in step S4, the controller 200 adjusts a value of LF power set in the recipe by using the adjustment amount of the LF power calculated in step S3, and determines the adjusted value of LF power as LF power after adjustment.

Next, the controller 200 causes a plasma process to execute in the plasma processing apparatus 1 (step S5). When executing the plasma process, the controller 200 causes the HF power after adjustment determined in step S4 to be applied to the plasma processing apparatus 1, and causes the LF power after adjustment determined in step S4 to be applied to the plasma processing apparatus 1. With respect to the other process conditions, the controller 200 sets the other process conditions to setting values stored in the recipe. After the plasma process is finished, the present process terminates.

As described above, according to the adjustment process of the present embodiment, increase in etch rate of a central portion of a wafer W that may occur when DC voltage is applied to the edge ring 24 can be suppressed. Thus, tilting of an edge portion of the wafer W can be suppressed with the applying of DC voltage to the edge ring 24, while increasing the controllability of the etch rate. Accordingly, degradation of process characteristics with respect to the wafer W when voltage is applied to the edge ring 24 is prevented.

The processing method and the plasma processing apparatus according to the embodiment disclosed herein are to be considered exemplary in all respects and not limiting. The above embodiment may be modified and enhanced in various forms, without departing from the appended claims and spirit thereof. Matters described in the above embodiment may take other configurations to an extent not inconsistent, and may be combined to an extent not inconsistent.

Voltage applied to the edge ring 24 is not limited to DC voltage, but may be an alternating current (AC) voltage. In a case in which AC voltage is applied to the edge ring 24, an AC power supply is connected via a matching device and a blocking capacitor, instead of the first variable power supply 55. The AC power supply outputs AC power having a frequency f at which ions in the plasma can follow, i.e., a radio frequency lower than an ion plasma frequency, and is configured to change its power, a voltage peak value, or a voltage effective value. When AC voltage from the AC power supply is applied to the edge ring 24 via the blocking capacitor during an etching process, self-bias voltage occurs at the edge ring 24. That is, a negative DC voltage component is applied to the edge ring 24.

The plasma processing apparatus of the present disclosure is applicable to any type of plasma processing apparatus, including a capacitively coupled plasma (CCP) type processing apparatus, an inductively coupled plasma (ICP) type processing apparatus, a processing apparatus using a radial line slot antenna (RLSA), an electron cyclotron resonance plasma (ECR) type processing apparatus, and a helicon wave plasma (HWP) type processing apparatus.

In the present specification, a wafer W has been referred to an example of an object to be processed. However, the object may not be limited thereto, but may be a various types of substrates used in a flat panel display (FPD), a printed circuit board, or the like.

What is claimed is:

1. A method of processing an object using a plasma processing apparatus including a stage that includes an electrostatic chuck on which the object is placed in a chamber and functions as a first electrode, an outer peripheral member disposed around the electrostatic chuck, a first variable power supply configured to apply direct-current (DC) voltage to the outer peripheral member, a first radio frequency power supply that applies first radio frequency power to the first electrode or a second electrode facing the first electrode, and a second radio frequency power supply that applies second radio frequency power having a frequency lower than a frequency of the first radio frequency power to the first electrode, the method comprising:
   applying the DC voltage from the first variable power supply to the outer peripheral member;
   adjusting at least one of the first radio frequency power and the second radio frequency power based on the DC voltage applied to the outer peripheral member by referring to information stored in a memory of the plasma processing apparatus, the information including a relationship between the DC voltage applied to the outer peripheral member and an adjustment amount for adjusting the at least one of the first radio frequency power and the second radio frequency power; and
   performing a plasma process under a process condition including the at least one of the first radio frequency power and the second radio frequency power that has been adjusted.

2. The method according to claim 1, further comprising: adjusting a process condition that affects density of plasma to be generated.

3. The method according to claim 1, further comprising: adjusting a process condition that affects an etch rate.

4. The method according to claim 1, further comprising: adjusting at least one of
   a gas supplied to the chamber,
   pressure in the chamber, and
   voltage applied from a second variable power supply to the second electrode facing the stage.

5. A method of processing an object using a plasma processing apparatus including a stage that includes an electrostatic chuck on which the object is placed in a chamber and functions as a first electrode, an outer peripheral member disposed around the electrostatic chuck, a first variable power supply configured to apply direct-current (DC) voltage to the outer peripheral member, a first radio frequency power supply that applies first radio frequency power to the first electrode or a second electrode facing the first electrode, and a second radio frequency power supply that applies second radio frequency power having a frequency lower than a frequency of the first radio frequency power to the first electrode, the method comprising:
   applying the DC voltage from the first variable power supply to the outer peripheral member;
   adjusting at least one of the first radio frequency power and the second radio frequency power based on the DC voltage applied to the outer peripheral member and an adjustment amount for adjusting the at least one of the first radio frequency power and the second radio frequency power, the adjustment amount being obtained beforehand and determined such that an etch rate at a center portion of the object in a case where the DC voltage is applied is not shifted from an etch rate at the center portion of the object in a case where the DC voltage is not applied; and performing a plasma process under a process condition including the at least one of the first radio frequency power and the second radio frequency power that has been adjusted.

\* \* \* \* \*